United States Patent [19]

McQuhae

[11] 3,775,191

[45] Nov. 27, 1973

[54] MODIFICATION OF CHANNEL REGIONS IN INSULATED GATE FIELD EFFECT TRANSISTORS

[75] Inventor: Kenneth George McQuhae, Ottawa, Ontario, Canada

[73] Assignee: Bell Canada-Northern Electric Research Limited, Ottawa, Ontario, Canada

[22] Filed: June 28, 1971

[21] Appl. No.: 157,116

[52] U.S. Cl..................... 148/1.5, 148/187, 29/571, 317/235 R

[51] Int. Cl.............................................. H01l 7/54

[58] Field of Search............................ 148/1.5, 187; 317/235 B, 235 G; 29/571

[56] References Cited

UNITED STATES PATENTS

| | | | |
|---|---|---|---|
| 3,653,978 | 4/1972 | Robinson et al. | 148/1.5 |
| 3,576,478 | 4/1971 | Watkins et al. | 317/235 B |
| 3,655,457 | 4/1972 | Duffy et al. | 148/1.5 |
| 3,596,347 | 8/1971 | Beale et al. | 148/187 X |
| 3,615,934 | 10/1971 | Bower | 148/186 |

*Primary Examiner*—G. T. Ozaki
*Attorney*—Sidney T. Jelly

[57] ABSTRACT

Method of producing channel regions in IGFET's by implanting ions in the gate region through the gate, the gate of polycrystalline silicon material. The method both produces conducting channel regions and removes conducting channel regions. Enhancement mode and depletion mode transistors can be made. Other devices, such as resistors, can be formed simultaneously or sequentially by the implantation step.

10 Claims, 15 Drawing Figures

MODIFICATION OF CHANNEL REGIONS IN INSULATED GATE FIELD EFFECT TRANSISTORS

This invention relates to the modification of channel regions beneath the gates of insulated gate field effect transistors, hereinafter referred to as IGFET's, and in particular the modification of the electrical properties of such regions.

The present invention provides for an increase in the speed of operation of IGFET circuits, a decrease in the threshold voltage of these devices and an increase in packing density of devices in a silicon chip of given dimensions. Other improvements may also be provided, depending upon the particular device, and its use.

Various ways of improving performance of IGFET devices exist. Ion implantation has been used with aluminum gate technology, resulting in reduced capacitance between the gate and the source and between the gate and the drain. This gives an increase in switching speed. There is also an increase in packing density.

Ion implantation has also been used, again in conjunction with aluminum gate technology, to fabricate a conducting channel between the source and the drain of a field effect transistor, creating a depletion mode device. This leads to lower essential power supplies and to faster integrated memory circuits.

A further alternative is a conventional diffusion process with polycrystalline silicon gate technology. The result is lower threshold voltages and increased device switching speed.

Using an aluminum gate as a mask for ion implantation gives better gate alignment than conventional technology, as does the polycrystalline silicon gate technology with diffusion but there is lateral diffusion with the polycrystalline silicon technology and therefore the reduction in parasitic capacitance is less than with ion implantation. However polycrystalline silicon gates give lower threshold devices than aluminum gates. It has therefore been a matter of choice as to which technology was used -ion implantation with aluminum gates or impurity diffusion with polycrystalline silicon gates- the choice influenced by the particular use the device is put to.

The present invention provides for ion implantation in the channel region under a polycrystalline silicon gate to alter the electrical properties of the channel region. As an extension of the present invention additional components are also formed by ion implantation simultaneously with the modification of the channel region, such as resistors.

In its broadest aspect the invention provides a method of modifying the electrical properties of the channel region in an insulated gate field effect transistor having a source and a drain in a substrate, including the steps of: forming a layer of gate oxide; depositing a layer of polycrystalline silicon material on the gate oxide; and exposing to an ion beam to implant ions through the gate into the substrate beneath the gate to modify the electrical properties of the channel region between the source and the drain. The invention is effective both to produce conducting channel regions and to remove conducting channel regions.

The invention will be understood by the following description of certain embodiments, by way of example, in conjunction with the accompanying drawings in which.

Figure 1:
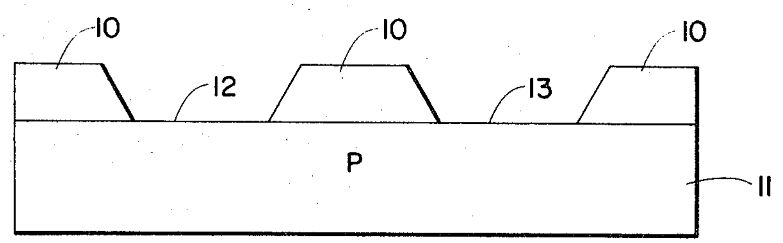
FIGS. 1 to 6 illustrate the sequential steps in the formation of a two transistor device having one enhancement mode transistor and one depletion mode transistor.
Figure 2:
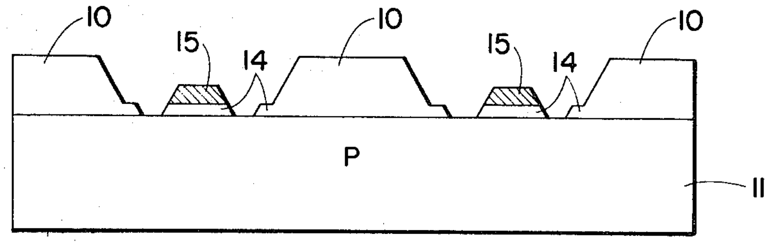

Fabrication of the device, as illustrated in FIGS. 1 to 6, is as follows. First, in FIG. 1, a field oxide layer of silicon dioxide 10, is grown on a p-type silicon substrate 11 and the field oxide selectively removed to form "windows" 12 and 13. A thin oxide layer 14 is formed, as by growing, in the windows 12 and 13 of the field oxide, a layer of polycrystalline silicon 15 is deposited and then the polycrystalline silicon is removed from all areas except where the gates are to be formed and windows are opened through the oxide layer 14 for subsequent diffusion. The device at this stage is illustrated in FIG. 2.

Figure 3:
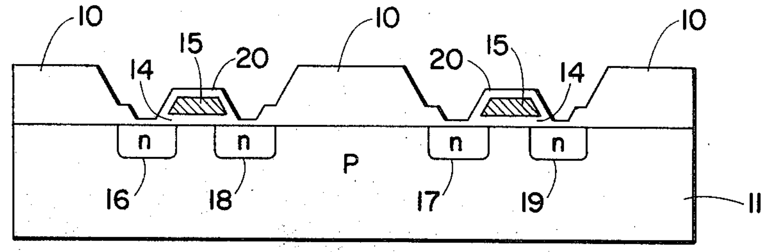

At the stage illustrated in FIG. 3 the sources 16 and 17 and drains 18 and 19 have been formed by diffusion with a suitable n-type dopant. At the same time the gates 15 are doped to make them good electrical conductors and the structure re-oxidized to form layer 20. In the next stage, FIG. 4, the enhancement mode element, indicated generally at 21, is masked by a suitable layer of material 22, such as ceramic, a metal or a glass. This protects element 21 from the ion beam. Following this the device is exposed to an ion beam and the electrical properties of the region below the gate 15 of the unmasked element 24 are modified, a conducting channel 23 being formed by the ion implantation through the gate 15. The masking material is then removed. This stage is illustrated in FIG. 5. If desired a heat treatment can be provided before or after removal of the masking material, to anneal any radiation damage.

Figure 6:
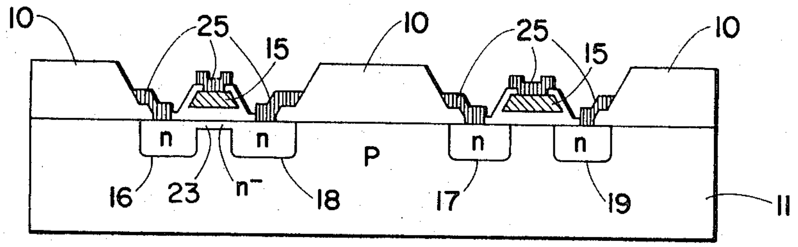

Windows are opened in the layer 20 formed by reoxidation and then a metal applied by evaporation. Finally the metal layer is removed from the undesired areas to leave the metallized portions 25, as seen in FIG. 6. There is formed the depletion mode transistor from element 24 and element 21 is an enhancement mode transistor.

The device illustrated in FIGS. 1 to 6 has two transistors 21 and 24, but it will be appreciated that a device may have only one transistor, of the form of transistor 24. Alternately a device may comprise more than two transistors, the form of which may vary one to another. However, with two transistors side by side, as illustrated, one is a depletion mode and the other an enhancement mode. In the example illustrated in FIGS. 1 to 6 and described above, the depletion mode is formed by the ion implantation, although it is possible to produce an enhancement mode by ion implantation, as will be described later.

Figure 4:
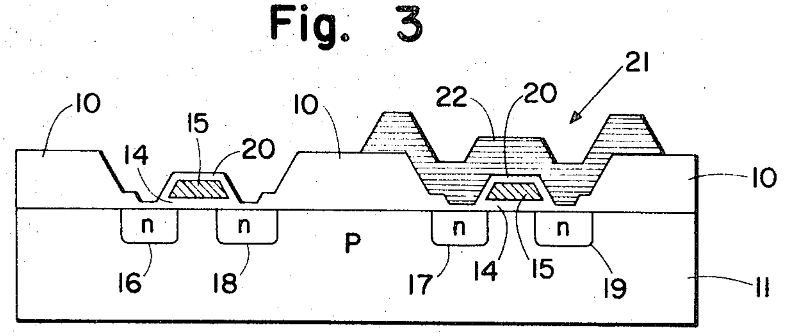
Figure 5:
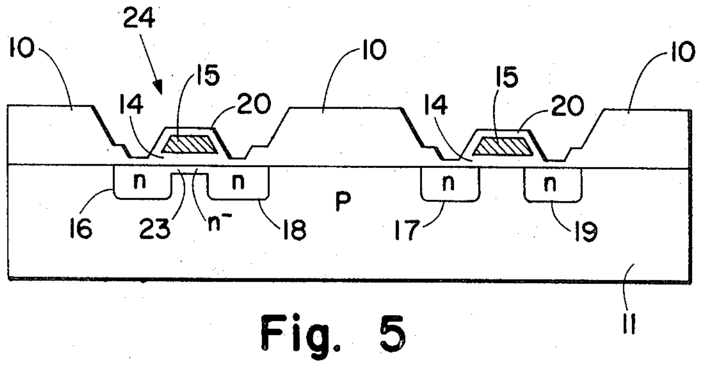
Figure 7:
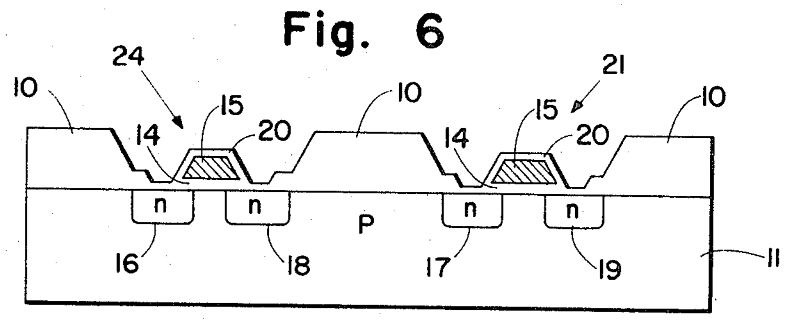
FIGS. 7 to 10 illustrate the sequential steps of an alternative method for making a device as in FIG. 6.
Figure 8:
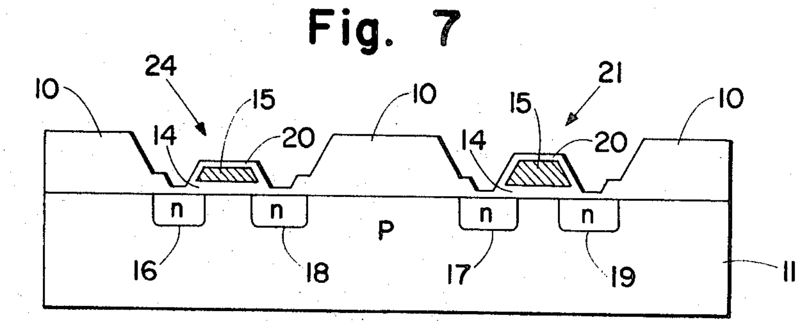
Figure 9:
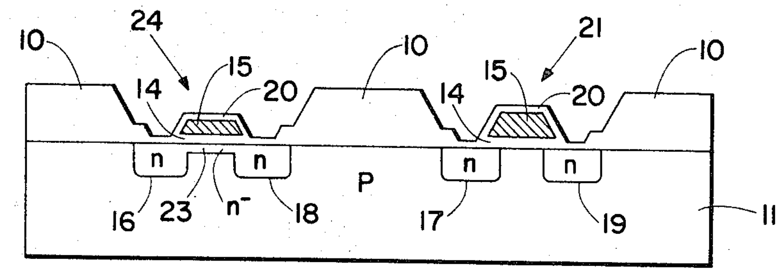
Figure 10:
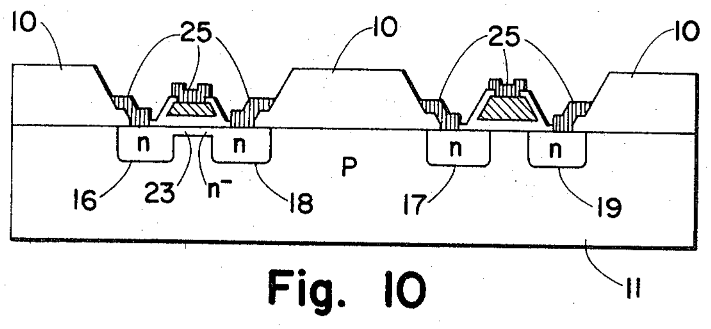

As an alternative to the use of a metal, glass or ceramic deposition to mask the element 21, FIG. 4, it is possible to provide a thicker layer of polycrystalline silicon for the gate of this transistor -the enhancement mode. This is illustrated in FIG. 7. The steps prior to the situation illustrated in FIG. 7 are the same as described above in relation to FIGS. 1 and 2. After deposition of the polycrystalline silicon layer 15, the layer for the depletion mode is reduced in thickness and is then reoxidized, as seen in FIG. 8. The device is then exposed to an ion beam and conducting channel 23 formed by the modification of the electrical properties of the channel region beneath the gate 15. In this particular example the additional thickness of the polycrystalline layer 15 For the enhancement mode transistor 21 acts as a shield or mask against the ion beam. This is seen in FIG. 9. The device is then processed, as in the previous example, by the formation of windows in the oxide layer 20 and metal applied. The metal is removed from the undesired areas to leave the metallized portions 25 as seen in FIG. 10. The device is substantially the same as the device in FIG. 6, the only difference being the thickness of the polycrystalline silicon layer 15 in the enhancement mode transistor 21.

Figure 11:
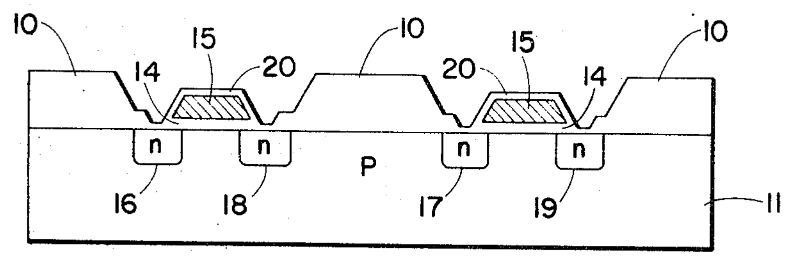
FIGS. 11 to 14 illustrate the sequential steps of a further method for forming a two transistor device.

As is well known, it is difficult to obtain perfect alignment of the gate with the source and drain. The present invention can be used to produce devices with perfectly self-aligned gates. The initial steps are as described above in relation to FIGS. 1 to 3, with the difference that the polycrystalline layers 15 are thicker and wider than in the example illustrated in FIGS. 1 to 6. FIG. 11 illustrates a device with the thicker and wider layers 15 applied and after the device has been oxidized.

Figure 12:
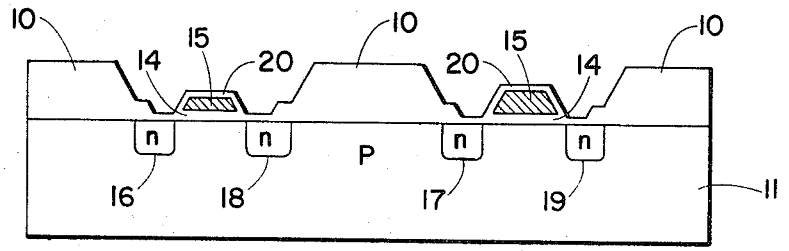
Figure 13:
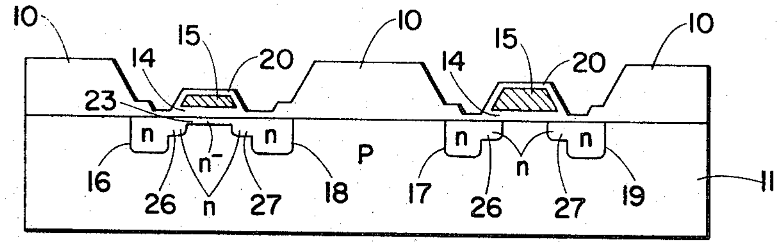
Figure 14:
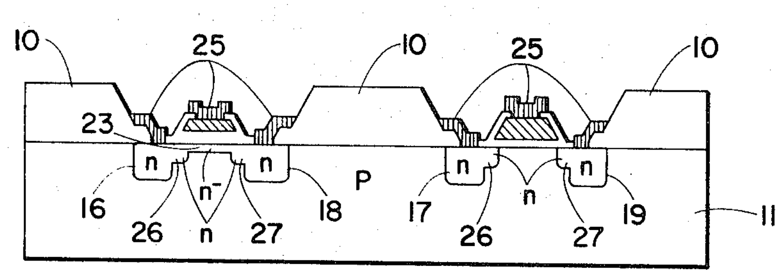

The gates 15 are then made narrower by a suitable photoengraving step. The edges of each of the gates 15 are slightly closer together than the opposed edges of the related sources 15 and 17 and drains 18 and 19. Then the gate 15 of the depletion mode element is reduced in thickness, and then the device is reoxidized. The state of the device at this stage is illustrated in FIG. 12. The device is then exposed to an ion beam and implantation of ions forms conducting channel 23. The extra thickness of the gate 15 in the enhancement mode element eliminates the need for the layer of material 22, such as ceramic, metal or a glass, as in FIG. 4. During a portion of the implantation step the regions of the substrate immediately adjacent the gates can be implanted to a concentration and a depth greater than that of the channel by suitable control of the energy and current of the ion beam, forming perfectly aligned sources and drains, as indicated at 26 and 27 of FIG. 13. Finally windows are formed in the oxide layer 20, the device is metallized and metal is removed from the undesired areas to provide the finished device, as in FIG. 14.

The methods described in relation to FIGS. 1 to 10 create a depletion mode transistor by implanting an n-type dopant which is one of the element in Group V of the periodic table, such as phosphorous, in a p-type substrate. Depletion mode p-channel transistors may be formed by implanting a p-type dopant, which is any one of the elements of Group III of the periodic table, such as boron, in an n-type substrate. If p-type substrates of high resistivity are used for an n-channel transistor, a non-implanted transistor will inherently operate in the depletion mode because a conducting channel exists in the region beneath the gate because of a positive charge in the oxide. The enhancement mode transistor can be made by implanting a p-type dopant -such as boron- beneath the gate 15 to form a lower resistivity p-type channel region, which effectively removes the conducting channel.

The method described in relation to FIGS. 11 to 14 produces both a depletion mode transistor and "perfectly" self-aligned gates. The method produces n-channel depletion mode transistors by implanting an n-type dopant such as phosphorous in the p-type channel region of the substrate. It is also possible to produce p-channel depletion mode transistors with this method beginning with an n-type substrate and implanting a p-type dopant. The perfectly aligned gate feature will not be obtained when implanting enhancement mode n-channel transistors in high resistivity p-type substrates as the dopant must be p-type for the channel and an n-type for the source and drain. To obtain perfectly self-aligned gates in an ion implanted enhancement mode n-channel transistor would require two implantations -a p-type implant for the channel and an n-type implant for the source and drain- with suitable masking.

In the process described in relation to FIGS. 11 to 14 an alternative is to omit the original contact diffusion and to dope the gate, the source and the drain by an implantation step. The implantation would proceed in two stages, one at a lower energy and a high dose to dope the source, drain and gate, and one at a higher energy and a low dose to implant the channel. In such a process, or method, the gates need not be etched to a narrower width, as described above.

Figure 15:
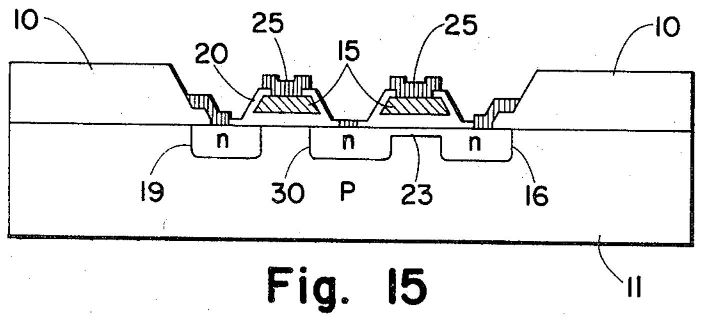
FIG. 15 illustrates a device comprising two transistors as formed on one chip.

Thus the invention enables the formation of insulated gate field effect transistors having ion implanted conducting channels to form a depletion mode transistor. By the use of silicon substrates of high resistivity, an enhancement mode transistor, rather than a depletion mode transistor may be formed by the ion implantation step. The invention can be used, with suitable masking techniques, to create enhancement and depletion mode transistors in close juxtaposition on the same chip. FIG. 15 illustrates such an arrangement, giving close juxtaposition and which can be used for circuits in which the two transistors are connected in series. The same reference numerals are used to indicate the same details as in the previous examples. The source of the depletion mode transistor 24 is made the one and the same as the drain of the enhancement mode transistor 21, as indicated at 30. The device illustrated in FIG. 15 is as made by the method described in relation to FIGS. 1 to 6, but it can also be made as described above in relation to FIGS. 7 to 10 or FIGS. 11 to 14.

The ion implantation steps can be used simultaneously or sequentially, to dope a "second level" polycrystalline silicon layer that may be used in place of aluminum to interconnect devices, or parts of the same device. By etching windows in the oxide layer 10 in suitable locations and of suitable dimensions the implantation step can be used to form resistors.

What is claimed is:

1. A method of forming a transistor device comprising at least two insulated gate field effect transistors, each transistor having a gate, and a source and drain aligned with said gate, and having a conducting channel beneath the gate of one transistor, comprising the sequential steps of:

growing a field oxide on a silicon substrate;

removing the field oxide to form windows through to the substrate at the desired positions of the transistors;

growing a layer of oxide on said substrate in said windows;

depositing a layer of polycrystalline silicon material on said oxide in each of said windows to form a gate;

removing the polycrystalline silicon from all areas except where a gate is required;

opening windows through each oxide at positions to define a periphery of each gate and to define positions for forming a source and a drain for each transistor, each window having an inner periphery coincident with the periphery of its associated gate;

diffusing a dopant through said windows in the oxide to form said sources and drains and simultaneously doping said gates;

applying a layer of oxide over the layer of polycrystalline silicon;

masking one of said windows to prevent ion implantation at that location;

exposing the device to a beam of ions to implant ions beneath the gate, through the polycrystalline silicon layer in the unmasked window to modify the electrical properties of the channel region beneath said gate connecting the source to the drain;

removing the mask;

opening windows in the oxide layer to provide access to each source, each drain and each gate layer of polycrystalline silicon; and applying a metal to the device to form connections to said sources, drains and gates.

2. A method as claimed in claim 1, for forming a depletion mode transistor, said substrate a p-type substrate, wherein the device is exposed to a beam of ions to form an n-channel beneath the gate in the unmasked window.

3. A method as claimed in claim 1, for forming a depletion mode transistor, said silicon substrate an n-type substrate, wherein the device is exposed to a beam of ions to form a p-channel beneath the gate in the unmasked window.

4. A method as claimed in claim 1 for forming an enhancement mode transistor, said silicon substrate a p-type substrate of high resistivity, wherein the device is exposed to a beam of ions to implant ions beneath the gate to form a lower resistivity p-type channel region.

5. A method of forming a transistor device comprising at least two insulated gate field effect transistors, each transistor having a gate, a source and a drain aligned with said gate, and having a conducting channel beneath the gate of one transistor, comprising the sequential steps of:

growing a field oxide on a silicon substrate;

removing the field oxide to form windows through to the substrate at the desired positions of the transistors;

growing a layer of oxide on said substrate in said windows;

depositing a layer of polycrystalline silicon material on said oxide to form a gate in each of said windows, the polycrystalline silicon in one window of a thickness to permit ion implantation beneath by a beam of ions, the thickness of the polycrystalline silicon in the other window sufficient to prevent ion implantation beneath by said beam;

removing the polycrystalline silicon from all areas except where a gate is required;

opening windows through each oxide at positions to define a periphery of each gate and to define positions for forming a source and a drain for each transistor, each window having an inner periphery coincident with the periphery of its associated gate;

diffusing a dopant through said windows in the oxide to form said sources and drains and simultaneously doping said gates;

applying a layer of field oxide over the layer of polycrystalline silicon;

exposing the device to a beam of ions to implant ions beneath the gate in the window having the thinner layer of polycrystalline silicon to form a conducting channel beneath the gate and connecting the source and the drain;

opening windows in the field oxide layer to provide access to each source, each drain and each gate layer of polycrystalline silicon;

applying a metal to the device to form connections to said sources, drains and gates.

6. A method as claimed in claim 5, for forming a depletion mode transistor, said silicon substrate a p-type substrate, wherein the device is exposed to a beam of ions to form an n-channel beneath the gate in the window having the thinner layer of polycrystalline silicon.

7. A method as claimed in claim 5, for forming a depletion mode transistor, said silicon substrate an n-type substrate, wherein the device is exposed to a beam of ions to form a p-channel beneath the gate in the window having the thinner layer of polycrystalline silicon.

8. A method of forming a transistor device as claimed in claim 5, wherein following the step of diffusing the dopant through the windows in the gate oxide to form sources and drains, the layer of polycrystalline silicon in each window in the field oxide are reduced in width, whereby an exposure to the beam of ions implantation also occurs in said substrate to form extensions to said sources and drains, at the ends of the channels, to form perfectly self-aligned gates in the transistors.

9. A method as claimed in claim 8, for forming a depletion mode transistor, said silicon substrate a p-type substrate, wherein the device is exposed to a beam of ions to form an n-channel beneath the gate having the thinner layer of polycrystalline silicon.

10. A method as claimed in claim 8, for forming a depletion mode transistor, said silicon substrate an n-type substrate, wherein the device is exposed to a beam of ions to form a p-channel beneath the gate in the window having the thinner layer of polycrystalline silicon.

* * * * *